United States Patent
Vujkovic-Cvijin et al.

(10) Patent No.: US 6,631,019 B1
(45) Date of Patent: Oct. 7, 2003

(54) RECONFIGURABLE MULTICHANNEL TRANSMITTER FOR DENSE WAVELENGTH DIVISION MULTIPLEXING (DWDM) OPTICAL COMMUNICATION

(75) Inventors: Pajo Vujkovic-Cvijin, Mountain View, CA (US); David E. Cooper, Palo Alto, CA (US)

(73) Assignee: SRI International, Menlo Park, CA (US)

(*) Notice: Subject to any disclaimer, the term of this patent is extended or adjusted under 35 U.S.C. 154(b) by 110 days.

(21) Appl. No.: 09/610,312

(22) Filed: Jul. 5, 2000

(51) Int. Cl.⁷ .............................................. H04B 10/04
(52) U.S. Cl. ..................... 359/187; 359/124; 359/133
(58) Field of Search .......................... 359/124, 133, 359/187; 372/20, 32

(56) References Cited

U.S. PATENT DOCUMENTS

| | | | |
|---|---|---|---|
| 4,398,293 A | 8/1983 | Hall et al. ................. 372/32 |
| 4,591,372 A | 5/1986 | Bricheno et al. .......... 65/402 |
| 4,707,061 A | 11/1987 | McMahon ................. 385/24 |
| 4,813,756 A | 3/1989 | Frenkel et al. ............ 385/73 |
| 4,829,533 A | 5/1989 | Hallberg et al. ...... 372/29.021 |
| 4,839,614 A | 6/1989 | Hill et al. ................ 359/238 |
| 4,896,327 A | 1/1990 | Ebberg ..................... 372/32 |
| 4,989,201 A | * 1/1991 | Glance .................... 359/133 |
| 5,347,525 A | * 9/1994 | Faris ....................... 372/19 |
| RE35,366 E | 10/1996 | Hall |
| 5,646,762 A | 7/1997 | Delavaux et al. ......... 359/173 |
| 5,673,129 A | 9/1997 | Mizrahi ................... 359/124 |
| 5,780,843 A | 7/1998 | Cliché et al. |
| 5,892,582 A | 4/1999 | Bao et al. ................. 356/519 |
| 5,949,580 A | 9/1999 | Chiappetta et al. ....... 359/618 |
| 5,953,139 A | 9/1999 | Nemecek et al. ........ 359/124 |
| 6,009,111 A | 12/1999 | Corwin et al. ............ 372/32 |
| 6,014,237 A | 1/2000 | Abeles et al. ............. 359/124 |
| 6,028,881 A | 2/2000 | Ackerman et al. ........ 372/75 |
| 6,044,189 A | 3/2000 | Miller ...................... 385/37 |
| 6,163,555 A | * 12/2000 | Siddiqui et al. .......... 372/32 |
| 6,222,861 B1 | * 4/2001 | Kuo et al. ................. 372/20 |
| 6,226,424 B1 | 5/2001 | Ball et al. |
| 6,271,944 B1 | * 8/2001 | Schemmann et al. .... 359/124 |

OTHER PUBLICATIONS

Berinetto, F. et al., *Stabilization of the Emission Frequency of 1.54 μm DFB Laser Diodes to Hydrogen Iodide*, IEEE Photonics Technology Letters, vol. 4, No. 4, pp. 472–474, Apr. 1993.

Dimmick, Timothy E. and Weidner, Janelle, *Simple, Inexpensive Wavemeter Implemented with a Fused Fiber Coupler*, Applied Optics, vol. 36, No. 9, pp. 1898–1901, Mar. 20, 1997.

Glance, B.S., et al., *Densely Spaced FDM Coherent Star Network With Optical Signals Confined to Equally Spaced Frequencies*, J. Lightwave Tech., vol. 6, No. 11, pp. 1770–1781, Nov. 1988.

Lampropoulos, George A. and Lessard, Roger A. (Eds.), *Applications of Photonic Technology2*, Plenum Press, New York, pp. 477–482, 1997.

(List continued on next page.)

Primary Examiner—Jason Chan
Assistant Examiner—Christina Y Leung
(74) Attorney, Agent, or Firm—Townsend Townsend & Crew LLP; Mark D. Barrish, Esq.

(57) ABSTRACT

A high performance reconfigurable DWDM transmitter incorporates discrete optical components placed in v grooves etched in a substrate. Direct wavelength monitoring can be achieved with wavelength modulation locking applied independently to a gas absorption line and to etalon fringes. A set of equally-spaced wavelengths may be provided by a set of lasers, or a single laser can be used for a number of fixed frequencies.

19 Claims, 7 Drawing Sheets

OTHER PUBLICATIONS

Mizuochi, Takashi, et al. *Frequency Stabilized 622–Mb/s 16–Channel Optical FDM System and Its Performance in 1.3/1.55 µm Zero–Disperson Fiber Transmission,* J. Lightwave Tech., vol. 13, No. 10, pp. 1937–1947, Oct. 1995.

Saitoh, T. et al., *Proposal of a Multiplex Optical Frequency Comb Generation System,* Photonics Technology Letters, vol. 8, No. 2, pp. 287–289, Feb. 1996.

Sudo, Shoichi, et al., *Frequency–Stabilized DFB Laser Module Using 1.53159 µm Absorption Line of C2H2,* IEEE Photonics Technology Letters, vol. 1, No. 10, pp. 281–284, Oct. 1989.

Têtu, Michel, et al, *Multiwavelength Sources Using Laser Diodes Frequency–Locked to Atomic Resonances,* J. Lightwave Technology, vol. 7, No. 10, pp. 1540–1548, Oct. 1989.

\* cited by examiner

Figure 1. Frequency Stabilized Diode Laser

Figure 3 Multichannel Reconfigurable DWDM Transmitter

RECONFIGURABLE MULTICHANNEL TRANSMITTER FOR DENSE WAVELENGTH DIVISION MULTIPLEXING (DWDM) OPTICAL COMMUNICATION

CROSS-REFERENCES TO RELATED APPLICATIONS

The present application is a regular patent application of and claims the benefit of priority from U.S. Provisional Patent Application Ser. No. 60/212,431 as filed Jun. 16, 2000.

BACKGROUND OF THE INVENTION

1. Field of the Invention

The field of the present invention relates in general to optical communication using inexpensive, stable and accurate devices for creating channels for wavelengths of light. More particularly, the field of the invention relates to a wavelength reconfigurable, multiple channel transmitter for optical Dense Wavelength Division Multiplexed signals.

2. Background

Optical fiber has nearly unlimited bandwidth, yielding 20 to 50 times more bandwidth than copper cable. Optical fiber is now the solution of choice at the wide area network (WAN) level. Implementation of fiber optic communication at the local area network (LAN) level will enable users to break current bottlenecks in the last mile of information transfer. A further attraction of fiber-optic technology is its scalability. Most current fiber LAN products are Ethernet-based in a range of 100-Mbit/second up to 1-Gbit/s. Fiber optical communication is easily scalable up to 10 Gbits/s, and several equipment vendors have announced fiber-optic links that can support transmission up to 1 terabit/s utilizing more than 128 DWDM.

Optical telecommunications networks require significantly increased bandwidth to handle current and projected communications traffic. Most optical networks use time division multiplexing (TDM) with a single laser transmitter as a means of combining many separate transmissions, allowing data rates of up to 10 Gbits/sec. The current market trend is toward systems that use many individual transmitters, each of a different wavelength to increase channel capacity (an approach known as wavelength division multiplexing, WDM). For example, a transmitter consisting of 8 distinct wavelengths provides 8× the capacity of a single channel network (e.g. 80 Gbits/sec). Furthermore, WDM systems are scalable to 16, 32, 64, 128 etc. distinct channels, and make the most efficient use of the extremely high bandwidth of optical fiber communication networks. Therefore, what is needed is a system for providing a stable, rapidly reconfigurable, multi-channel source for WDM and DWDM (dense-WDM) optical communications networks which can meet anticipated bandwidth demand.

A fiber optic communication link provides a virtually noise free medium for transporting complex signals without distortion and interference. Fiber optic cable has losses as low as 1–2 dB per kilometer, which is much lower than the 1–2 dB per 100 ft. for coaxial cables. Due to high frequency of laser light, fiber optic cables provide a bandwidth in which many channels of information can be transported across-a single fiber cable. The laser diodes' high efficiency, small size, high reliability, and low cost ($5–$10 for infrared, $40–$50 for visible light) make them the ideal choice for communication devices. However, other components in these devices escalate the cost of present optical DWDM transmitter devices.

Low cost optical DWDM optical communication devices are not available in the market due to the current trend toward integrating costly solid state semiconductor lasers and associated optical structures, and because optical solid state control structures are new and changing rapidly. The latest integrated optical components are created lithographically on a semiconductor chip substrate or on glass. However, it is very difficult and expensive to make multiple lasers lithographically (in VLSI) which are locked to a reference grid.

Therefore, what is needed is a way to reduce the cost of building state of the art DWDM optical communication devices. What is also needed is a method for shifting the burden of providing a high performance DWDM optical communication system from costly precision optical components to inexpensive solid state control structures. It would be desirable to achieve a high performance DWDM transmitter using low cost optical components having a wider range of tolerances than is presently possible Conventional WDM/DWDM sources lack stabilized frequency referencing and rapid reconfigurability in the event one or more lasers fail or are disrupted. Fabry-Perot interferometers (FPIs) have been used to attempt to lock a laser to a stable frequency. Fabry-Perot Interferometers used as scanning interferometers can sense extremely small wavelength shifts when piezo-electric actuators (PZTs) are used for tuning the multi-pass dual mirror optical cavity. However, these interferometers require adequate wavelength references for long-term stability.

Molecular absorption line sources from various gases have been tried, in particular acetylene, and offer a potential medium for multi wavelength referencing. However, their unevenly spaced absorption lines and absorptive operation makes them difficult to tune for FPI-based spectral applications. FPIs with narrowly—spaced uniform transmission peaks (~100 GHz) have often been considered for an absolute frequency reference when locked to atomic or molecular absorption lines. Glance, B. S. et al. (1988), "Densely Spaced FDM coherent Star Network with Optical Signals Confined to Equally Spaced Frequencies," IEEE J. Lightwave Technol. LT–6:1770–1781. and others. While there have been some applications for stabilizing laser arrays, such methods are restricted in wavelength positioning and require active feedback control in conjunction with costly precision optical structures, thereby driving up costs.

Fiber Bragg gratings (FBGs) can produce a narrow band response around a single wavelength. However, their narrow response band and over wavelength span poses limitations. Some of the current alternatives for optical transmitters provide only partial solutions. Examples of some conventional solutions and their disadvantages are described below. Most describe an optical reference source. None use a gas spectral line reference source.

U.S. Pat. No. 5,892,582 discloses a fiber Bragg grating (FBG) source which provides spectral output at a selected wavelength within a wavelength range. Thus, the FBG is used to provide a reference wherein the spectral output of the FBG marks a peak of a comb identifying its wavelength. The FBG comb is used as the reference frequency source. This approach is taken because atomic or molecular spectral lines are deemed unsuitable for the purpose of providing a stable reference source due to unevenly spaced absorption lines, and therefore are too restrictive in wavelength positioning. While this is useful in identifying and measuring wavelengths of radiation from optical sources, it does nothing to provide an inexpensive multi channel reconfigurable optical transmitter.

U.S. Pat. No. 5,646,762 discloses another conventional approach to establishing a reference source comb using a voltage source connected to a detector and tunable etalon comb of frequencies. A digital processor connected to a photodetector and to the voltage source controls the tunable etalon. The digital processor further contains memory for storing tuning voltages for wavelengths and for storing tuning voltages for temperatures. However, this provides a costly partial approach limited to providing only a comb of uniformly spaced optical channels from an already presumed stable input reference frequency source. Furthermore, there is no provision for establishing a stable reference frequency source for the etalon comb, or to provide stability for multiple channels or reconfiguration of channels.

U.S. Pat. No. 5,949,580 discloses a controllable light amplitude divider for dividing light at a particular wavelength into two portions, which together represent the amplitude of the input light. The arrangement can be cascaded in a manner which operates as a multiplexer or demultiplexer. The main thrust of the '580 patent is to provide a fast multiplexer and demultiplexer using an etalon. This arrangement requires costly precision optical components and is not suitable for a high performance reconfigurable DWDM application. Furthermore, the '580 patent is not a solution for an optical transmitter, which has many other functions, and the multiplexer/demultiplexer scheme is not necessary for a most optical transmitters U.S. Pat. No. 4,813,756 discloses a device for interconnecting or for linking two optical fibers comprising a mechanically rotatable etalon arrangement. The '756 patent principally creates a device for interconnecting two optical fibers. While multiple etalons are used in various configurations, this does not provide a full multichannel optical transmitter, but rather a partial and very expensive way to connect DWDM fiber. '756 also claims optical channel selection filter mounted for coupling two single mode optical fibers.

U.S. Pat. No. 4,707,061 discloses an optical communications system using a resonant cavity for supporting a set of resonant modes and introducing predetermined reference wavelengths. A means for controlling the resonant cavity tunes one resonant mode to the wavelength of a fixed wavelength light source. Semiconductor laser sources are used in conjunction with resonant cavities which must be present at the transmitter as well as the receiver, thereby adding expense and complexity to an all ready cumbersome scheme to communicate over an optic network.

U.S. Pat. No. 5,673,129 discloses a plurality of optical transmitters for outputting optical signals, at least one optical wavelength selector communicating with the optical transmission. The wavelength selector includes a Bragg grating member with a wavelength band of high reflectivity. The wavelength band of high reflectivity for each Bragg grating member corresponds to an optical channel output. The '129 patent provides a closed loop optical system and uses semiconductor lasers, thereby resulting in a costly approach and complex system using gain bands, amplifier stages and pumps.

U.S. Pat. No. 6,014,237 discloses a multi wavelength mode-locked (MWML) laser source including a semiconductor optical amplifier (SOA) disposed in a cavity of the MWML laser source. The SOA is actively driven by a radio frequency (RF) signal and emits periodic pulses within a plurality of discrete wavelength bands simultaneously. The semiconductor optical amplifier and radio frequency (RF) signal driver make this a relatively expensive solution. The '237 patent also requires that input signals be multiplexed by a high speed electronic time domain multiplexer (ETDM) to a higher bit-rate electronic data stream for coding by an optical modulator in the optical pulse stream emitted by the MWML-DWDM. This results in complex design and interfacing requirements which are not suited to a practical, low cost implementation.

U.S. Pat. No. 6,044,189 discloses a temperature compensating fiber Bragg grating contained in an optical fiber. The '189 patent is concerned with the improvement of control of a fiber Bragg grating, only one possible component of a DWDM system.

U.S. Pat. No. 6,028,881 discloses a pump source tunable among a plurality of pumping wavelengths; a plurality of waveguide lasers responsive to respective pumping wavelengths for emitting light. The '881 patent introduces a method of combining solid state waveguide lasers with semiconductor lasers and enhancing electrical tunability. Components include intra-cavity pumping and pump reflectors. These require expensive integrated optics to manufacture.

U.S. Pat. No. 5,953,139 discloses an analog light wave communication system having at least two optical transmitters. The first WDM receives optical information signals from the optical transmitters and multiplexes the optical information signals to a composite optical signal at an output. Each input of the WDM comprises at least one optical resonant cavity; an oscillator circuit providing a single tone modulation signal and a phase modulator having an optical input coupled to the output of the WDM. The single tone modulation signal drives a composite optical signal which is too restrictive for most optical transmitter uses.

Conventional WDM/DWDM sources fail to provide the stabilized spectral frequency referencing or the rapid optical channel reconfigurability necessary for a high performance, low cost optical DWDM system. The design of conventional optical transmitters is directed toward the use of integrated optics wherein all optical components are created lithographically on a semiconductor chip substrate or on glass. These can be difficult and expensive to manufacture, as multiple lasers must be locked to a reference grid lithographically, using VLSI techniques.

Conventional DWDM approaches are not cost-competitive in the metro markets where they must compete with lower cost all electronic products which are more dynamic and operate at lower bandwidth demands. Most conventional DWDM systems operate at OC-48. As demand for higher bandwidth increases, these data rate demands will migrate to Metro markets. Therefore, what is needed are low cost optical devices which are dynamic from a standpoint of configurability and can meet higher bandwidth demands.

DWDM optical devices demand very large bandwidths. A failure of one optical channel affects multiple protocol stack layers and thus large numbers of users. Therefore, in the event of a failure at the channel level, restoration must occur at multiple stack levels. The speed of restoration is critical. Bandwidth reservation is an option for these slower layers, but this requires that excess idle capacity must be built in at the optical device level.

In the protocol layer scheme for optical channels, the Internet Protocol (IP) layer is carried by the ATM layer below. IP over DWDM presents topology node architecture issues. There is a virtual mapping between the physical and logical topology of IP over ATM, which leads to scaling challenges. One of the solutions is-to make every switch into a router. The current cost of optical routers makes this a very expensive solution. What is needed are inexpensive optical switches and routers.

In high reliability networks, reconfigurability options are necessary. However, conventional designs are very expensive. For example, each channel has a fixed-frequency laser, in addition to the laser that carries the data, the "active" laser. The fixed frequency laser is a spare, identical to the active laser that initially carries the modulated signal. The spare laser must be prepared to carry the modulated signal on the active laser's specific carrier frequency. Both lasers are generally physically located in the same rack.

Thus, in the event of a laser failure, the spare fixed-frequency laser takes functional control on only the designated frequency and signal. However, this approach forces the manufacturer to fabricate a redundant number of lasers, at least one spare for each active laser, to ensure a high reliability device. Therefore, what is needed is an optical channel device which requires fewer lasers, lower production cost and provides high reliability. What is also needed is a DWDM transmitter which is reconfigurable, not only with respect to lasers, but also across channels.

SUMMARY OF THE INVENTION

In order to overcome the foregoing deficiencies in conventional optical DWDM systems, an aspect of the invention provides a high performance reconfigurable DWDM transmitter incorporating low cost discrete optical components which can be placed in v grooves etched in a silicon optical micro-board or the like, keeping costs of manufacturing low. The lasers are packaged in modules based on the technology of meso scale optics. The physical size of a multi channel module is no bigger than a conventional single laser module.

In another aspect of the invention, direct wavelength monitoring is achieved by using a wavelength modulation locking technique applied independently to a gas absorption line and to etalon fringes. The frequency stability and resolution achieved thereby make it possible to pack channels closely and achieve spacing up to the modulation limit, filling the available bandwidth. This now enables high density DWDM to populate as many channels as desired to the modulation limit.

An aspect of the invention uses a set of n lasers and k spare sources, wherein each laser is actively locked to a set of equally spaced wavelengths according to the ITU frequency grid, and simultaneously to a stable spectral reference wavelength. The set of equally spaced frequencies is generated by an etalon, acting as a frequency comb generator. The absolute wavelength standard is provided by a gas absorption cell. The wavelength of each channel can be changed on a millisecond (msec) time scale under microprocessor control in the event that any channel should fail, thereby enabling substantially instantaneous reconfigurability.

According to this aspect of the invention, a separate (fixed frequency) spare laser is not needed for each active (fixed frequency) laser. The invention enables a single laser to be used as a substitute for a number of fixed-frequency lasers, and a number of fixed-frequency spare lasers as well.

In addition, any "active" laser (i.e. a laser already assigned to a particular channel, not a spare) can be reassigned to a different channel, if necessary, which further improves network reliability. If all spare lasers within a module should fail, and an active laser at the most valuable channel fails as well, the system still can carry the traffic over the most valuable channel by reassigning a laser from one of a lesser used or less valuable channels to the most valuable channel, until physical replacement of lasers is made. The modulation signal is switched electronically to modulate the spare laser instead of the laser that failed

BRIEF DESCRIPTION OF THE DRAWINGS

These and other features and advantages of the present invention will become more apparent to those skilled in the art from the following detailed description in conjunction with the appended drawings in which.

DESCRIPTION OF THE PREFERRED EMBODIMENT

Figure 1:
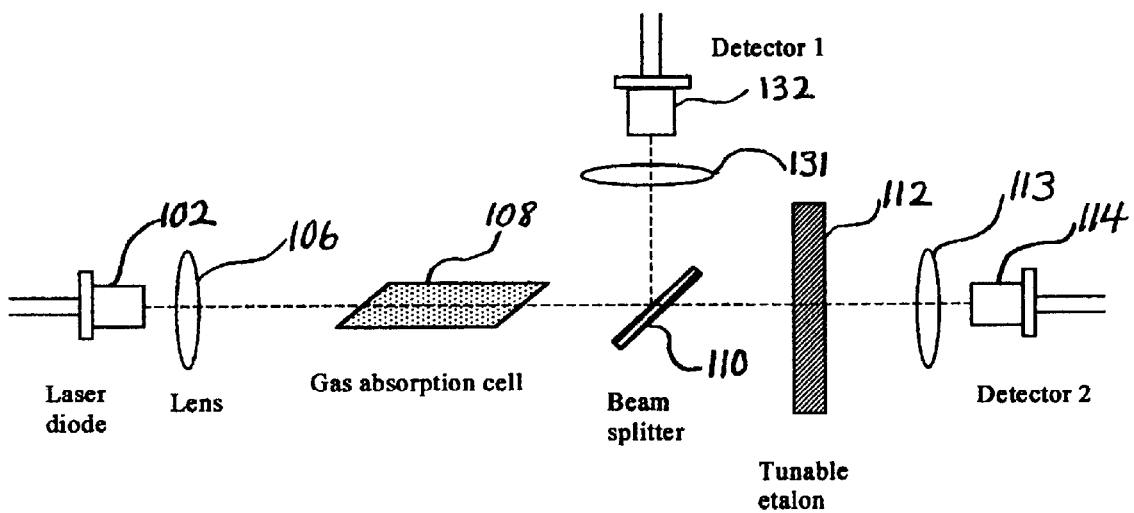
FIG. 1 is a diagram showing basic components of a frequency stabilized laser for one channel according to an aspect of the invention.

FIG. 1 shows the basic components of a frequency stabilized diode laser wherein stablization occurs through a spectral line. An overview of a simple mode of operation for one channel starts with a laser source 102, in this case a tunable diode laser. The laser light is directed into a collimating lens 106 and into a gas absorption cell 108, comprising a chamber holding gas of known spectral line characteristics. This gas is used to lock onto a reference frequency (wavelength) using wavelength modulation spectroscopy (WMS), also known as derivative spectroscopy. A beam splitter 110 can be used to forward a part of the beam through a lens 131 and to a photodetector 132 which enables the laser frequency to be compared and tuned to a spectral line frequency of the known gas in the reference gas cell 108.

This part of the process is designed to be a self-tuning procedure: the diode laser 102 is turned on, and locked to a gas absorption line from gas absorption cell 108 using a standard WMS technique. Detector 132 is used to monitor light transmission through-the cell 108, and a reference frequency control loop 528 (FIG. 5) includes a microprocessor (530 shown in FIG. 5) for feedback in tuning laser 102 to the reference frequency. The gas absorption cell 108 contains a suitable gas, for example acetylene, which has numerous well-known narrow absorption lines in the 1550 nm optical communications window. Other gases may be used for other-windows as needed. Wavelength modulation spectroscopy is implemented with diode lasers having the advantages of small size, non-intrusiveness, speed, and ease of use.

Next, the reference frequency stabilized diode laser is frequency locked to a sequential fringe frequency of a (temperature) tunable stable Fabry-Perot etalon 112. The beam proceeds through to the etalon 112 which is tuned to a position where an etalon transmission fringe coincides with the laser wavelength locked to the reference spectral line derived from gas absorption cell 108. Passing through a lens 113 and into Detector 2 114, the transmission is monitored for tuning. The free-spectral range of the tunable etalon 112 is chosen to be equal to the required ITU grid spacing (e.g. 100 GHz for the current ITU standard), thus the etalon 112 transmission spectrum consists of a series of regularly spaced transmission peaks. Each of these transmission peaks will constitute a channel when fully initialize, tuned and configured.

Figure 2:
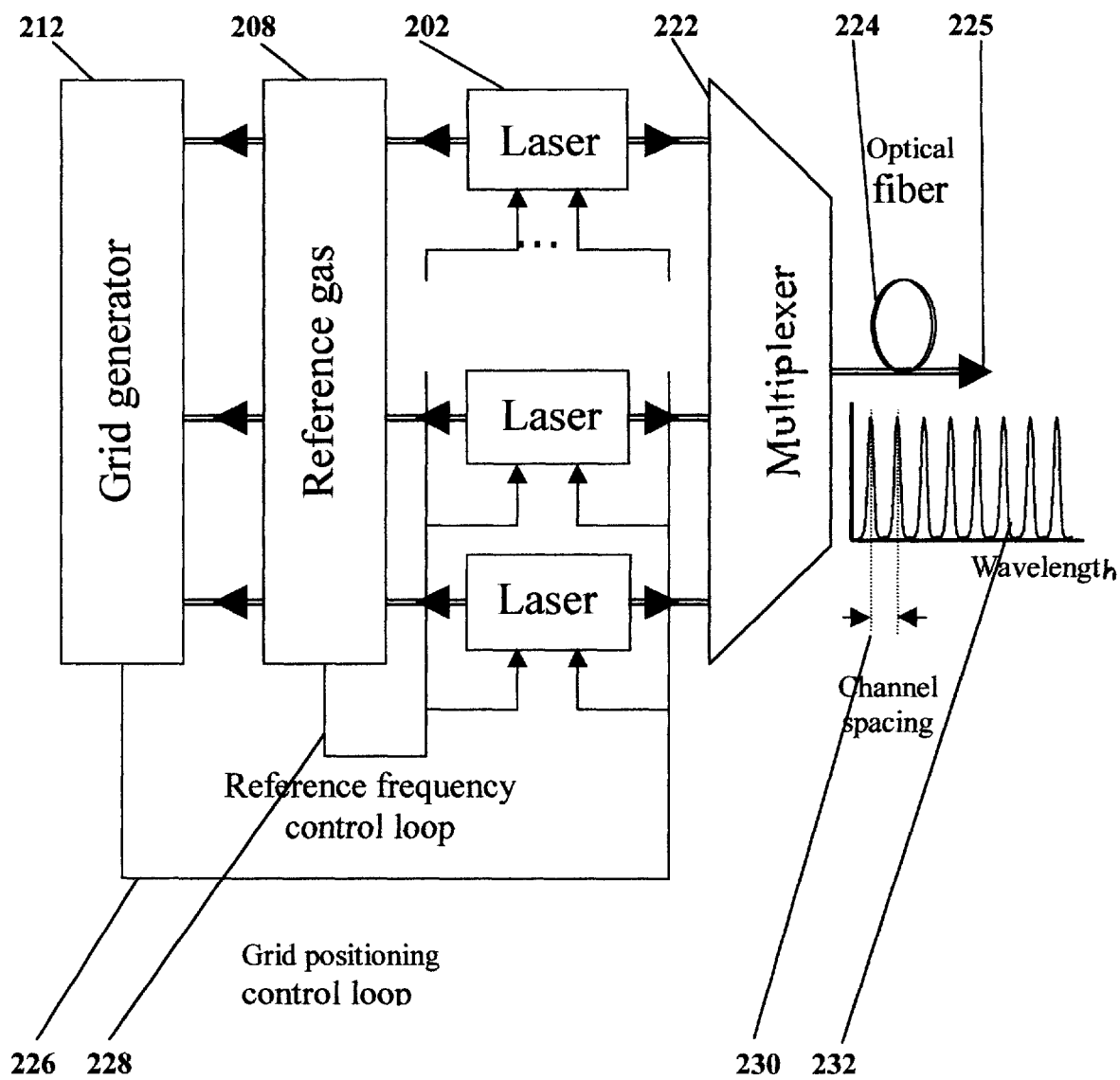
FIG. 2 is a schematic diagram showing a multi-channel re-configurable DWDM transmitter according to an aspect of the invention.

FIG. 2 is a block diagram showing a multi-channel re-configurable DWDM transmitter. The channel shown above in FIG. 1 is just one of n channels in a bank. Referring to FIG. 2, one common gas cell 208 comprising a gas of a known spectral line frequency and one etalon, also called the grid generator 212 establish a stable frequency grid for a plurality (n) number of independent active lasers 202 and therefore (n) channels. All lasers 202 have the same reference data structures since they all lase through the same gas cell 208 and are locked onto successive fringes produced by common etalon 212. The reference frequency control loop 228 enables initialization and tuning of each laser in the bank to the reference spectral frequency derived from gas cell 208 in a well known manner. The grid positioning control loop 226 sequentially tunes each independent active laser 202 in the bank to one of the fringe frequencies of grid generator 212 using the grid positioning control loop 226 for stabilizing and controlling the fringe count and fringe frequency tuning.

Direct monitoring of output wavelength within grid positioning control loop 226 and reference frequency control loop 228 is used to stabilize lasers 202. Direct wavelength monitoring is achieved by using well known laser spectroscopy wavelength modulation locking techniques applied independently to a gas absorption line derived from gas cell 208 and to etalon fringes derived from the grid generator. This is far superior to using "blind" control loops to stabilize a laser's temperature and current 212 as is done in many conventional DWDM systems. Both control loops 226 and 228 are microprocessor controlled and provide two essential stages in the system initialization to lock and maintain lasers at stable frequencies. Thus, the initialization provides self-stabilizing and self-calibrating optical channels.

These two processes are under the control of two independent frequency control loops, the first one tunes the laser and controls the laser injection current; the second one tunes the etalon by controlling its temperature. The two control loops could be merged into the same electronic digital control circuit as well. The two independent control loops 226, 228 also enable independent control of a plurality (n) lasers 202 to be connected in parallel in a bank: This makes possible a configurable feature of the optical transmitter, which is covered in detail below.

Reference positions are now firmly defined and each laser 202 in the bank is locked to a fringe frequency. These dense wavelengths (refer to FIG. 4) are then multiplexed into the optical communication fiber 224. That is, the fiber optic cable is physically hardwired to the output of the transmitter module. This is an advantage in reconfiguration in that the optical paths of alternate or spare lasers are always connected to the output of transmitter module 225. The optical fiber output carries different wavelength light 232 at uniform channel spacing 230.

Figure 3:
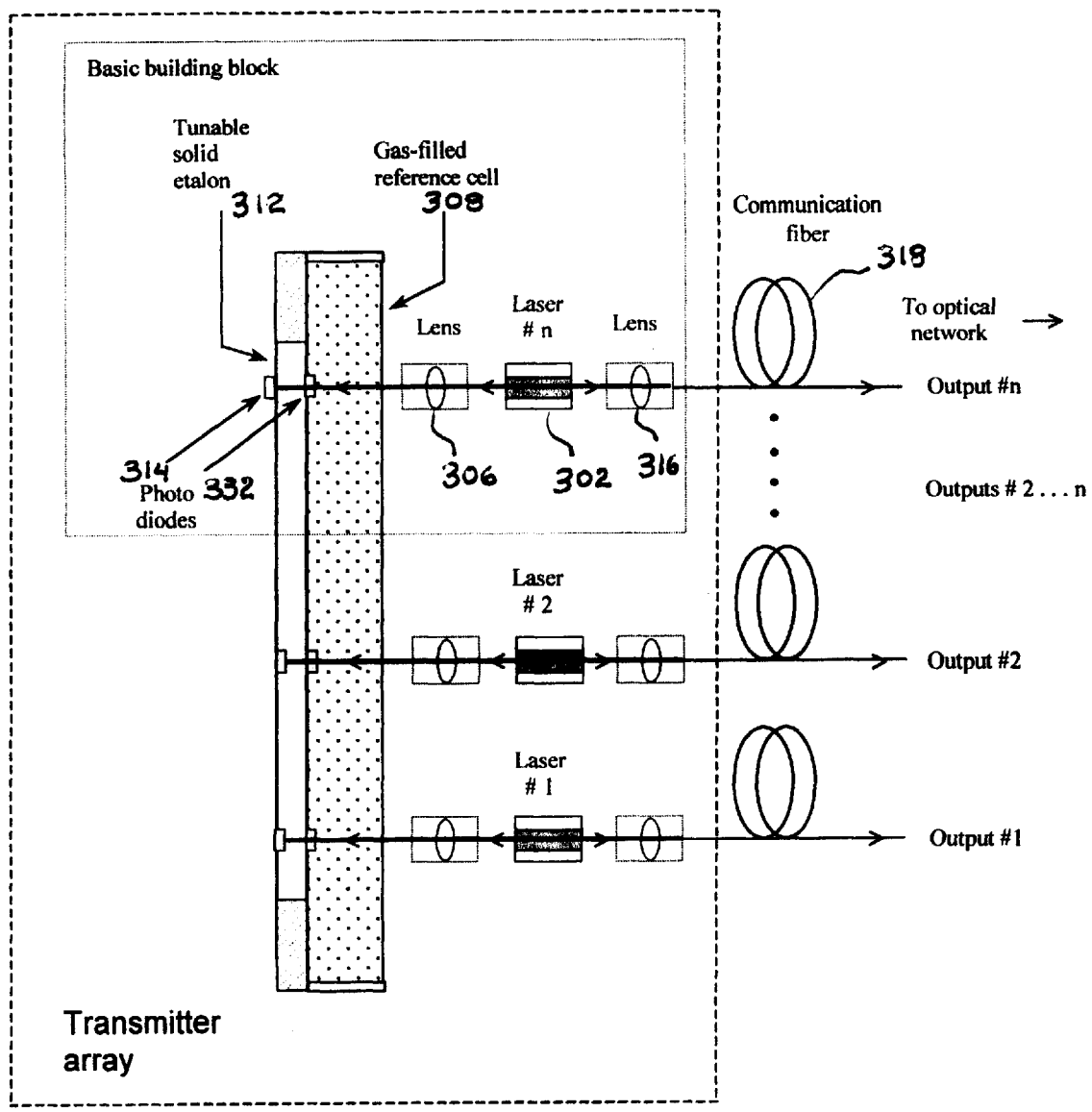
FIG. 3 is a diagram showing a simple configuration of a multi-channel reconfigurable transmitter according to an aspect of the invention.

FIG. 3 is a diagram showing another configuration of a multi-channel re-configurable transmitter according to an aspect of the invention. Referring to FIG. 3, a plurality (n) of laser diodes 302 are connected in parallel in a bank. Although many types of laser sources can be used, the lasers are preferably Distributed Bragg Reflector (DBR) lasers with a characteristic tunability of 10–30 nanometers in a single mode output or narrow band output. Such lasers are typically low cost and tuneable over a wide range in comparison to other lasers. DBR lasers offer the widest wavelength coverage. Distributed Feedback (DFB) lasers are acceptable as an alternative if each laser is required to a small wavelength range, i.e., a small number of channels. The laser beams are collimated in corresponding GRIN lenses 306 and directed into the gas absorption cell 308. A common gas absorption cell 308 provides a molecular absorption line stabilized to a molecular transition, which is the reference frequency for all lasers. The reference stablized beams then pass to a first set of photodetectors 332 which enable frequencies to be mapped to voltages which provide the feedback loop means for tuning the lasers to the stabilized molecular absorption line. Upon initialization, the lasers 302 become locked to an absolute reference frequency.

The stable reference tuned lasers are further directed into the etalon 312 and on to the second set of detectors 314, where they are each tuned to an etalon comb frequency fringe. The etalon 312 is a solid etalon comprising a glass plate with coated surfaces and is temperature tunable, as is well known. The output transmission spectrum from the etalon 312, that is, the distance between peaks and valleys in the corresponding wave form produced by the etalon, depends on the index of refraction, temperature and thickness of the etalon. The detectors 314 and 332 are photo diodes having a spectral range of (for example) 155 nanometers and are gallium arsenide photo diodes. However, other lasers with suitable characteristics may be used. Examples are: diode lasers, gas lasers, chemical lasers, masers, or the like. The feedback loops are shown in FIG. 2. The bank of tuned laser diodes 302 and their corresponding channels are optically coupled to the fiber optic transmission line 318. The etalon 312 (e.g. 10–100 GHz free spectral range) serves as the generator of an optical frequency comb with e.g. 10–100 GHz separation. Each of the lasers 302 is tuned to one of the fringes produced by the etalon 312, and the etalon grid is locked there by its respective frequency control loop (228 in FIG. 2).

Each laser 302 is passively stabilized so that, at the starting point, it finds itself within the capture range of the loop, centered around a reference wavelength $\lambda_0$. Each laser 302 is then brought to a wavelength $\lambda_n$ by either temperature or injection current tuning, or both. Starting from the reference wavelength $\lambda_0$, each laser 302 is in the next step brought to any position on the etalon grid (400 in FIG. 4) produced by etalon 312 by tuning its wavelength in the selected direction (direction from the reference frequency fringe to a selected fringe), and monitoring the laser output as it passes through etalon fringes produced by etalon 312. The position of the laser's frequency on the etalon grid 400 is determined by counting the fringes. In this way, each laser 302 can be tuned to any of n wavelengths ("channels"). The channels are independently modulated (data impressed on the laser carrier) with either an external or an internal (electro-absorption) modulator, integrated in the diode laser chip.

The device operates and initially tunes itself under standard microprocessor control techniques which are well known, which is simple and inexpensive. The entire system operates under the microprocessor control, which performs the auto-calibration procedure described above. In this way, an aspect of the invention provides a multi-wavelength source for DWDM that is self-calibrating, self stabilizing and self tunable. This aspect of the invention provides an advantage over conventional systems in that if one of the lasers should fail, resulting in a temporary channel loss, an alternate laser can be tuned to the desired wavelength.

Figure 4:
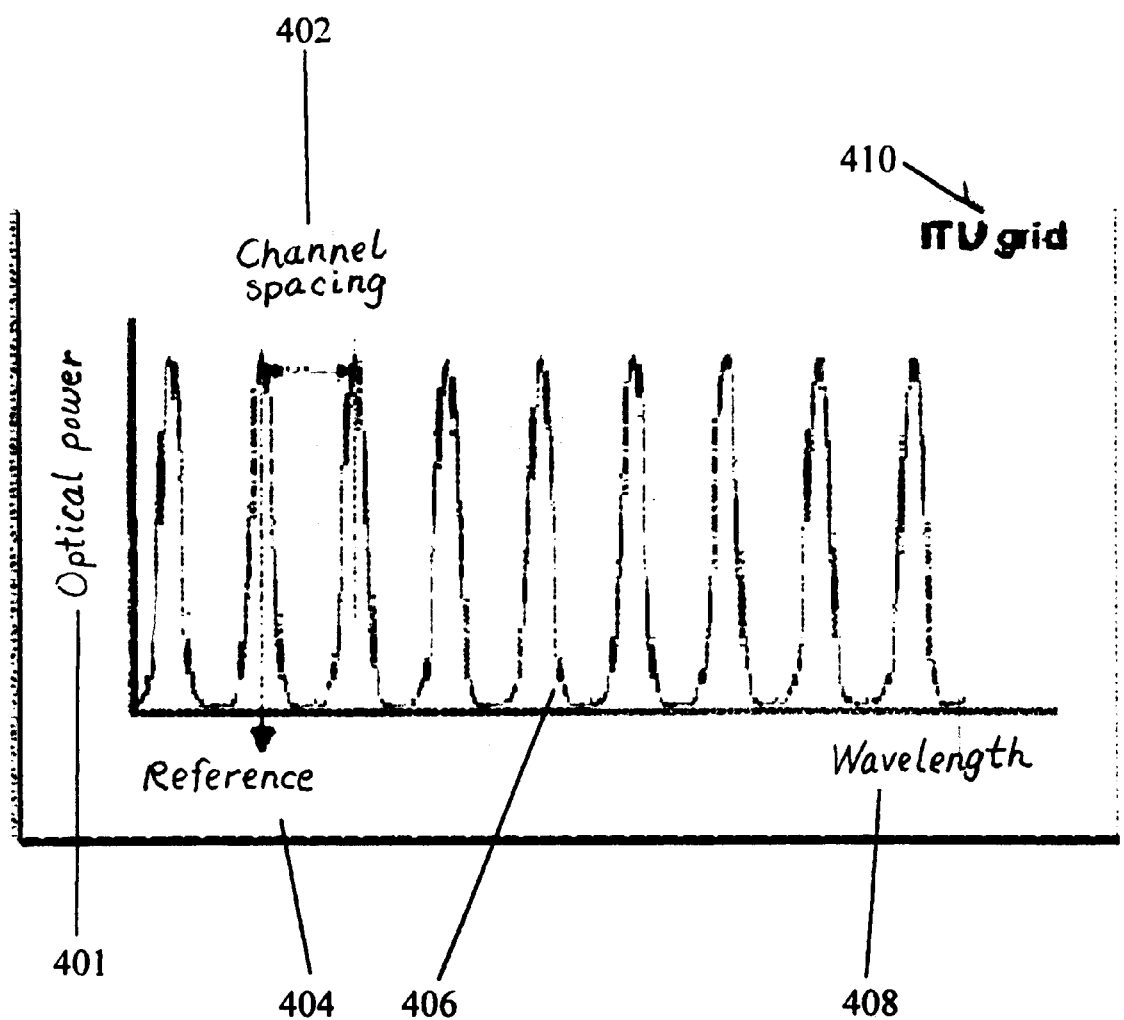
FIG. 4 is a graphical display illustrating the output produced by a multi-channel re-configurable transmitter according to an aspect of the invention.

FIG. 4 is a graphical representation of a wave form illustrating the output produced by a multi-channel re-configurable transmitter. The transmission spectrum is shown as optical power 401 as a function of wavelength 408. The reference source wavelength 404 provides an anchor for a uniform spacing output grid, such as ITU grid 410. (ITU grid 410 is an etalon grid with a specific channel spacing.) For example, the grid 410 consists of frequencies with channel spacings 402 which comply with ITU standards.

An aspect of the invention is shown in FIG. 2 wherein laser tuning is accomplished using two independent control loops, the first control loop capable of locking an entire comb. The second loop locks any laser in a plurality of lasers to a given point on the comb. This thereby provides superior frequency stability and resolution. The frequency stability and resolution achieved with this aspect of the invention makes it possible to pack the channels closely and achieves stability and spacing reduction possible down to the modulation limit, thereby filling the available bandwidth. This now enables high density DWDM to populate as many channels as desired to the modulation limit.

The ability to populate as many channels as desired up to the modulation frequency may provide enabling technology for a low cost switchless network; in particular, a high density metropolitan switchless network.

Figure 5:
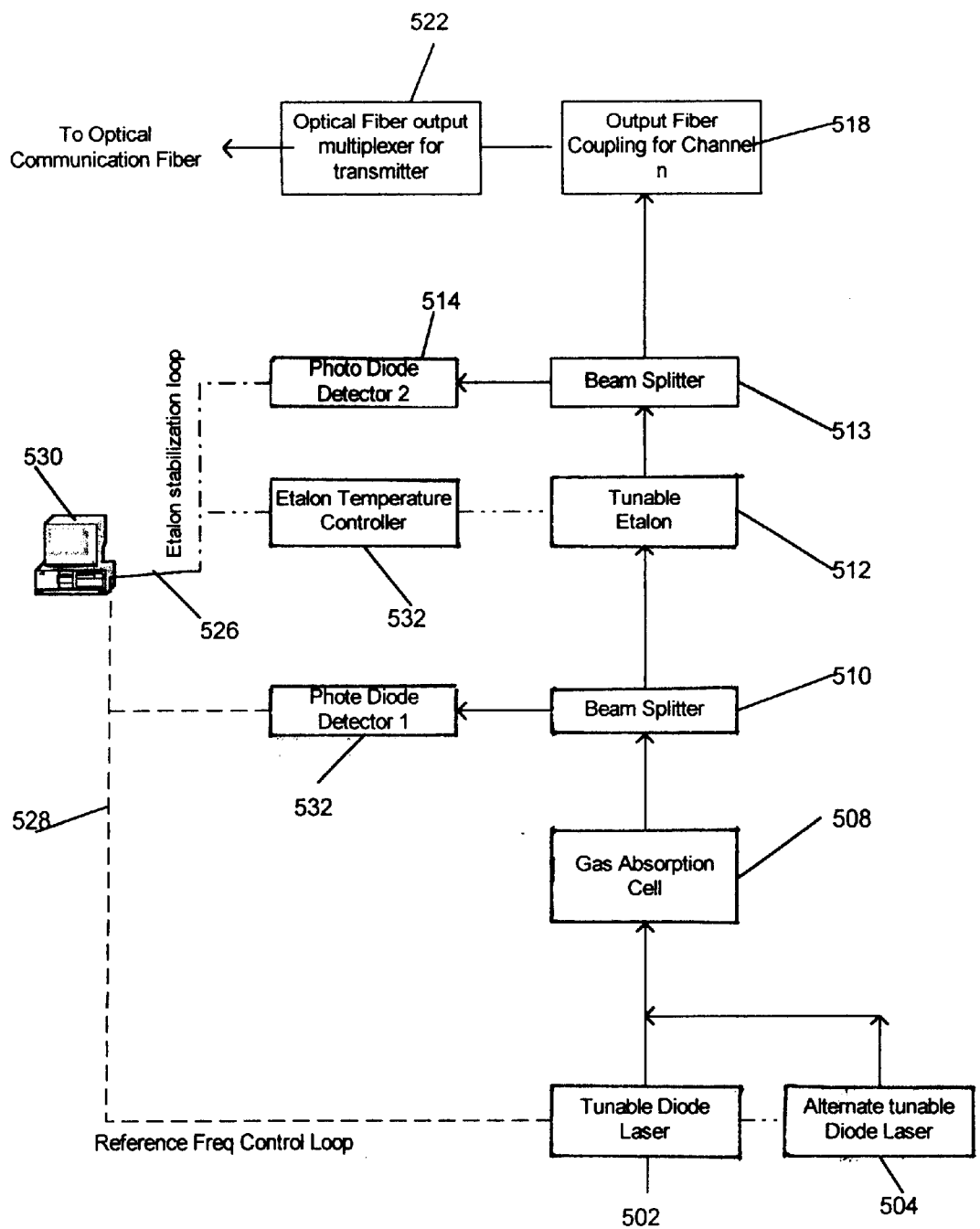
FIG. 5 is a block diagram illustrating operative connection of components according to an aspect of the invention.

FIG. 5 is a block diagram illustrating the operation of the control of the laser path through its optical components. It will be appreciated that the optical path is decoupled from its electronic control elements. This decoupling enables production of a high performance, fully reconfigurable DWDM transmitter through the use of inexpensive electronic components. It shifts the burden of providing high density DWDM from costly precision optical components integated in VLSI to inexpensive electronic control circuitry. In FIG. 5, the control elements and circuits are depicted in broken lines and the optical paths are drawn in solid lines.

In operation, when laser 502 is turned on, first detector 532 looks at output using standard wavelength modulation spectroscopy. Laser 502 is tuned under microprocessor control in a known manner over a wavelength range in which it finds the absorption line of the gas in the gas absorption cell. Some of the beam can be diverted through the use of a beam splitter 510 and directed to a first detector 532.

First detector 532 provides control information to the reference frequency control loop which is applied in real time to keep the laser 502 wavelength locked to the absorption line. To accomplish this, first detector 532 measures the intensity of the beam, detects the peak of absorption line, a control mechanism provides information on laser wavelength coincident with the absorption line, determines whether laser wavelength is coincident with the absorption line or not then makes a correction signal to 502 corresponding laser.

Correction is applied so the first detector 532 always sees whether the laser wavelength is coincident with gas absorption line. Once the microprocessor/controller 530 recognizes the laser wavelength is stable and locked to a reference source 508, microprocessor/controller 530 tunes the etalon 512 by changing the temperature and monitoring the output of second detector 514. The detector 514 is maximum amplitude seeking and detects when a local peak or comb tooth wavelength is found. The microprocessor 530 receives the signal from the second detector 514. Etalon 512 has a transmission spectrum consisting of a fringe or comb. As microprocessor/controller 530 tunes the etalon, it moves the comb in wavelength space and makes one fringe of the comb coincident with laser wavelength. Since the reference frequency is known from the reference frequency control loop 528 and coincident with one of the comb frequencies, microprocessor/controller 530 can set any laser frequency by counting the fringes while changing the wavelength of the tunable laser 502 by changing the injection current to the laser 502 or the etalon temperature 532 or both.

In this fashion, microprocessor/controller 530 can tune any of the lasers 502 to any of the channel frequencies 406. For example, to tune laser 502 to fringe 406, microprocessor/controller 530 addresses laser 502 by first tuning to absorption line. Once the reference point is known on the etalon grid 512, microprocessor/controller 530 counts the fringes while changing the wavelength of the laser by changing the injection current or the etalon temperature or both. The second detector 514 provides a correction signal to the etalon stabilization loop 526 which locks the tunable etalon to the wavelength of the laser wavelength desired. By reading the output of the second detector 514, microprocessor/controller 530 can use this information to make light to go through tunable etalon fringes and lock on to any desired frequency.

The foregoing process establishes a reference grid with stable defined wavelengths at any point, which can be described as a reference wavelength +/− integer number of free spectral range spaces. This equals distance between fringes or channel spacing and is shown in FIG. 4.

The tuned laser is directed into the output coupling 518 by optical fiber connection which is then multiplexed into the optical fiber transmitter output 522. The optical path is preserved by having all lasers multiplexed into the communication fiber 522 at all times. That is, individual channels 518 are physically hardwired (optically connected) to the output fiber 522. All lasers, even spares or alternates 504 not currently active, are connected through the use of couplers, to the output of the transmitter multiplexer 522 module, and the lasers go online "active" as needed during reconfiguration. Thus, an aspect of the invention provides the capability to reconfigure individual tunable lasers to maintain optical network integrity.

Each of the lasers 502 is tunable over any number of channels (e.g. 10–20). Therefore, lasers 502 are wavelength selectable, as well as wavelength re-configurable. Since each laser 502 in the bank can be tuned to work on a multiplicity of wavelengths or "channels" and we also have a dynamically selectable wavelength multi-channel transmitter.

The microprocessor/controller 530 manages a lookup table. The look up table is produced during the initial calibration process and stored in the memory of a controller 530. The parameters in the lookup table include individual laser operating points, and parameters, such as injection currents, Bragg reflector control currents, substrate temperatures and individual wavelength modulation signal output addresses, comb fringe count and other data needed to reconfigure (under software control) laser operation in the event of a channel failure. Replacing a laser that has failed without manual intervention by microprocessor/controller 530 which incorporates a look up table comprising operational parameters of all currently active lasers. When a failure is sensed, microprocessor/controller 530 elects an alternate laser, initializes the new laser to the failed channel specifications, attaches the failed laser's modulated signal to the new laser channel and continues operation within 20–50 milliseconds or less. This operation is seamless and transparent to a user due to the tolerances in communication protocol.

Upon an active laser 502 failure, the detector 514 senses the failure of the down fringe, and notifies the microprocessor/controller 530 of the failed comb number. Other convenient ways of sensing laser failure are well known and also may be employed. The microprocessor/controller 530 initializes an alternate laser 504 to the properties of the failed laser 502 found in the lookup table. The spare 504 is tuned to the wavelength of the failed channel 502 and the modulated signal is vectored to the spare 504 laser for transport.

The foregoing aspects of the invention provides a reconfigurable transmitter, whereby any tunable spare laser can be brought on line substantially instantaneously and automatically, upon an active laser failure, regardless of the failed laser's carrier wavelength. In addition, if the spare fails immediately or before another active laser fails, another spare can be brought on line to substitute for the spare, thus providing an additional back up. This chain of redundancy can progress to exhaust all spares, thereby providing an extremely high reliability and reconfigurable device, which is not possible with conventional DWDM transmitters. With the exhaustion of all spares, active channel lasers can be substituted for the highest demand or load carrying channels to continue the operation. This is not currently possible with the optical transmitters. This aspect of the invention provides a method requiring far fewer spare lasers, while still increasing transmitter and therefore network reliability, simply by virtue of the reconfigurability for any number of fixed-frequency lasers.

Figure 6:
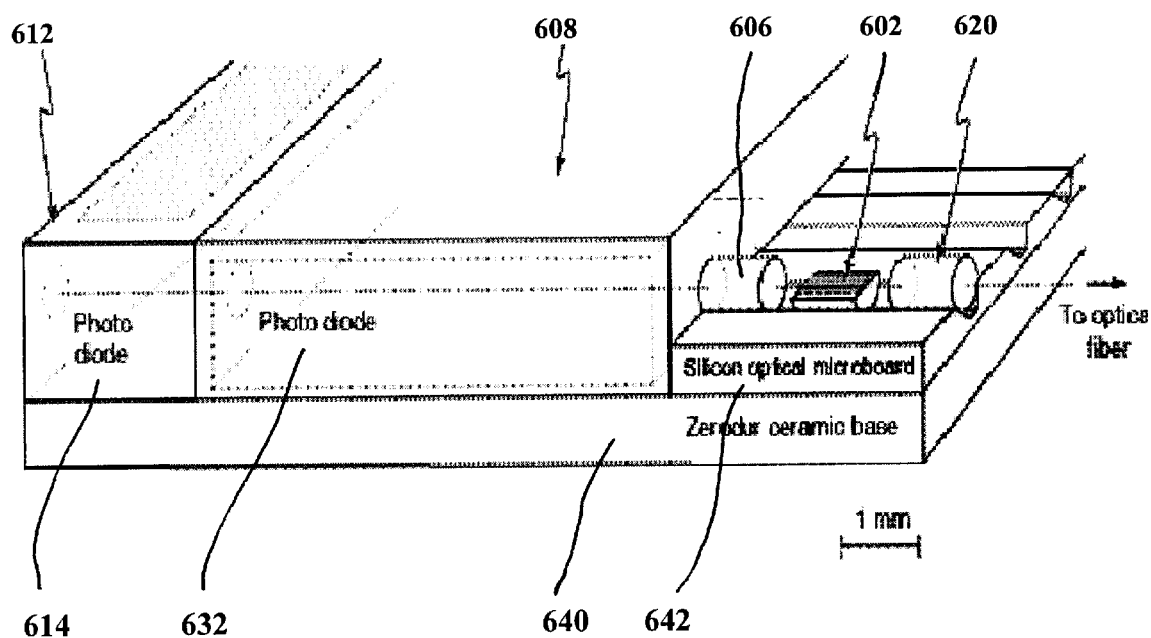
FIG. 6 is a drawing showing an example implementation of a low cost multichannel re-configurable transmitter according to an aspect of the invention.

FIG. 6 is a drawing of a low cost implementation of multi-channel re-configurable transmitter according to an aspect. of the invention This aspect of the invention provides a modular, meso scale approach which decouples the performance of an optical DWDM transmitter from the performance of its optical components. It eliminates the need for costly lithographic integration of optical components, while at the same time incresing channel capacity to the modulation limit as set forth above.

FIG. 6 shows a low cost meso scale implementation which uses discrete optical elements mounted on v grooves etched in a silicon 642 optical micro-board. Laser diode 602 is disposed between lens 606 and lens 620 as shown. Gas cell 608 and etalon plate 614 are all discrete, components mounted in the v grooves 642. This is in direct contrast to conventional integrated optics, wherein all optical components are created lithographically on a semiconductor chip substrate or on glass. Discrete optical components according to an aspect of the invention enable system to be modularized.

This embodiment eliminates the need for difficult to manufacture and expensive to make multiple lasers which are locked to a reference grid lithographically, using VLSI techniques. An aspect of the invention provides a solution by using low cost discrete optical components which can be placed in v grooves etched in silicon optical micro board. Lasers 602 are packaged in modules based on the technology of meso scale optics. The physical size of a multi channel module is not bigger than the current single laser module, on the order of millimeters.

Referring to FIG. 6, a DBR laser 602 is mounted on a silicon optical microboard 642. A DBR laser is low-cost relative to a fixed frequency distributed feedback laser DFB, currently used. The entire assembly is fixed to a ceramic base 640 or other suitable substrate.

The individual signal input circuitry converts the digital signal to the modulated analog signal via D/A converter. The intensity of the DBR laser 602 diode is modulated by adding AC current to the laser diodes' bias current. Many other means to do this are possible and well known to those skilled in the art. This still enables precise and simple control of the quiescent current. Bias current is necessary to keep the laser diode operating in a region where the relationship between the AC current and the change in intensity of the output is semi-linear.

The optical section transmits the signal from the lasers to the detectors through a Gradient Index (GRIN) 606. The GRIN lenses 606 and 620 are mounted in the grooves 642 on a silicon optical micro board, or other suitable substrate for mounting modular optical components.

A GRIN 620 is also used to introduce the laser light into the fiber on the output end. The light propagates in the fiber where signals multiplexed onto the output transmitter fiber. Since the beam of a diode laser diverges severely from its source, a lens must be used to focus the light onto the fiber 622. To minimize the loss between the photo diode and the fiber a GRIN lens is used. GRIN lenses 620 collimate a beam with minimal loss and aberration because their index of refraction varies radially due to dopants infused into the glass of the lens. By using a GRIN lens with an uneven fractional pitch length, the photo light can be focused on the tip of the fiber.

The light then travels from the GRIN 606 through the gas absorption cell 608 and impinging on the photodiode 632. The signal from a photodiode 632 (in the absorption case) is fed to the reference control loop for tuning the laser to the gas spectral line frequency. This signal is used in real time to lock the light to the reference frequency. This allows the remaining light traveling through the etalon 612 impinging on the second detector 614 to have a base reference frequency from which to tune to a comb frequency. The signal from the photodiode 614 is fed to the etalon grid control loop for tuning to an individual comb frequency.

In another aspect of the invention, by using active control, high performance DWDM is achieved with low cost optical components of much looser specifications than is presently possible. In other words, this aspect of the invention shifts the burden of maintaining high performance from expensive optical components to inexpensive electronic control components.

Figure 7:
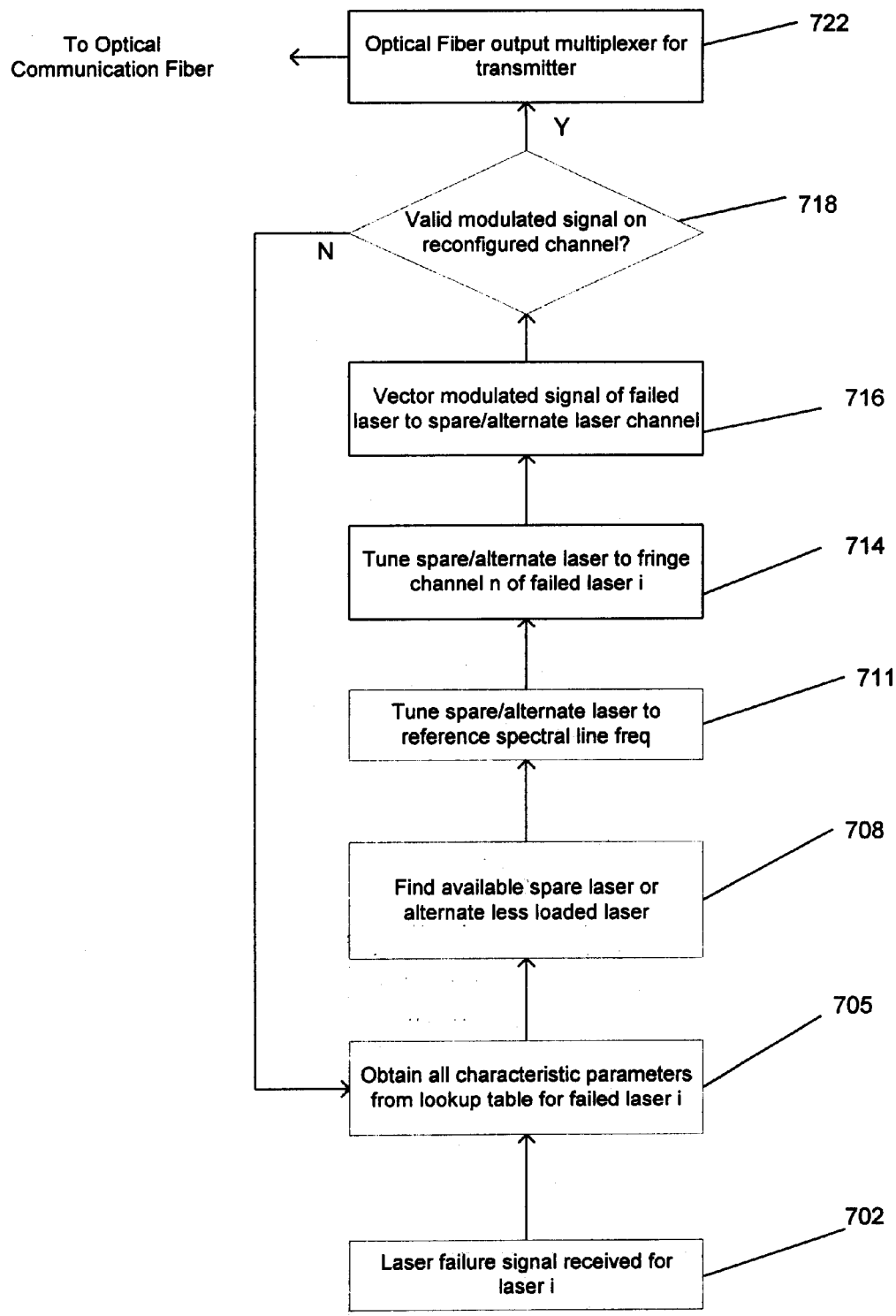
FIG. 7 is a flow chart of the control logic which enables reconfigurability according to an aspect of the invention.

FIG. 7 shows the control logic steps in the reconfiguring of a failed optical channel. A laser failure signal starts the reconfiguration processes 702. The network has 20–50 milliseconds to activate another laser to take over the functioning of the failed laser for this to be seamless to light router protocol.

For example, laser no. 3 operates at 1552 nm and drops out, thereby producing a failure signal 702. The micro controller now must go to a spare or alternate laser and obtain all characteristic parameters from the incorporated lookup table. The lookup table contains all the parameters for the failed laser 705 which are to be used in the spare laser.

All the necessary parameters for the failed channel are stored in the controller lookup tables 705. These parameters contain, among other data, individual laser operating points, injection currents, Bragg reflector control currents, substrate temperatures and individual wavelength modulation signal output addresses, comb fringe count.

The lookup table provides the injection current and the specific substrate temperature. The micro controller then selects an available spare laser or less loaded alternate laser 708. There are typically two spare lasers for every eight active lasers. However, any convenient ratio of spares to active lasers may be employed. To tune the spare/alternate laser to a reference spectral line frequency 711, the micro controller applies an injection current of about 35 mA to the active region and any correction, as the laser control loop is open while tuning.

Next, the micro controller tunes the spare/alternate laser to fringe channel n of failed laser m 714. There are several ways to do this and a combination may be the best. Micro controller counts the fringes while changing the wavelength of the laser by changing the injection current or the temperature or both. The micro controller increases the injection current on the selected alternate/spare laser and monitors the second detector to see if signal of the selected laser is coincident with fringe count of the failed laser. The micro controller keeps count of the fringes as it increments to match the lookup table fringe number of the failed laser.

Another method may simply use the Bragg reflector control current from the lookup table to tune to the desired fringe, for example, 25 ma to the Bragg region. When the micro controller has tuned the spare to the failed laser fringe frequency, it has established a carrier for the channel.

The modulated signal must then be applied to the spare laser carrier channel. This can also be done in several ways. A simple way is to keep the modulated signal output circuit address in the lookup table for each laser and transfer this information to the spare laser upon laser failure. The laser modulation signal is switched electronically to modulate the spare laser instead of the laser that failed. The modulation may be direct, or by means of a built in electro absorption modulator. If the modulator is an external device, nothing needs to be switched, the external modulator does not care where the carrier light comes from.

As is well known, quality control is implemented to insure that the reconfigured channel is indeed carrying the interrupted signal 718. If the modulated signal is back on-line, a have a valid reconfiguration has been established. The foregoing steps are then repeated with an alternate laser until the micro controller reestablishes a reconfigured channel.

Conventional high speed Internet Protocol (IP) routing is challenged by greatly increasing volumes of traffic. The capability to re-configure channels rapidly and automatically in accordance with the foregoing aspects of the invention, provides a basis for the accommodation of advanced routing protocols such as resource reservation RSVP or multicasting. MPLS (Multiple Protocol Lambda Switching) over DWDM depends heavily on restoration through redundancy. Thus, the foregoing aspects of the invention could be applied to provide improved MPLS.

The frequency stability and resolution achieved by the foregoing aspects of the invention make it possible to pack communication channels closely and maintain stability and spacing up to the modulation limit, thereby filling the available bandwidth. This would enable a high density DWDM system to populate as many channels as desired up to the modulation limit, and may support a switchless optical network or enable the implementation of fault tolerant optical routers.

While this invention has been described in connection with what are presently considered to be the most practical and preffered embodiments, it is to be understood that the invention is not limited to the disclosed embodiments, but on the contrary, it is intended to cover various modifications and equivalent arrangements which are included within the spirit and scope of the appended claims.

What is claimed is:

1. A system for reconfiguring a multi-channel dense wavelength division multiplexing (DWDM) transmitter for use in optical communication, comprising:

a plurality of lasers tunable to any one of a plurality of transmitter channels;

a stable independent reference for providing a known spectral feature for locking a reference laser frequency onto the spectral feature to thereby provide a spectral line frequency;

feedback loop means for monitoring the reference laser frequency with respect to the spectral line frequency;

a Fabry-Perot etalon providing an optical frequency comb characterized by periodic spectral features between regularly spaced comb interference fringe frequencies;

means for locking the frequencies of the frequency comb to the spectral line frequency; and control means for stabilizing each of said lasers to a respective comb frequency.

2. A system as in claim 1 wherein said lasers comprise diode lasers, gas lasers, chemical lasers, or masers.

3. A system as in claim 1, wherein the stable reference comprises a gas absorption cell.

4. A system as in claim 1, wherein the control means comprises a feedback loop, and further comprising means for tuning the frequency of each laser to the desired point on the frequency comb, the electronic means for tuning comprising a microprocessor/controller.

5. A system for reconfiguring a multi-channel Dense Wavelength Division Multiplexing (DWDM) transmitter for use in optical communication, comprising:

a gas cell for producing a known gas spectral line;

means for locking a reference frequency to the gas spectral line, thereby providing a stable reference frequency for a reference laser;

feedback loop means responsive to the reference frequency for maintaining a stable lock onto the gas spectral line;

a variable frequency etalon generating an optical frequency comb of regularly spaced fringe lines, the frequency comb tuned in response to the reference frequency;

means for tuning each of a plurality of lasers independently to a respective fringe of the optical frequency comb to thereby provide an independent carrier frequency on each fringe; and means for modulating an independent signal onto each independently tuned laser, such that the DWDM transmitter can provide any number of stable, selectable independent DWDM channels.

6. A system as in claim 5 further comprising means for tuning said fringe lines of the optical frequency comb to channel frequencies.

7. A system as in claim 5 wherein the channel frequencies are separated according to fiber optic telecommunication standards.

8. A system as in claim 5 further comprising a plurality of lasers wherein each laser is capable of carrying an independently modulated signal.

9. A system as in claim 5 further comprising means for replacing a selected DWDM laser assigned to transmit on a particular wavelength with an alternate spare laser, such that the spare laser takes over the functioning of the replaced laser, transmitting the replaced laser's exact frequency and modulated signal substantially instantaneously, on a millisecond time scale, thereby enabling restoration of DWDM optical layer communication without disruption to transmission of any modulated signals.

10. A multi-channel Dense Wavelength Division Multiplexing (DWDM) transmitter for use in optical communication, comprising:

a plurality of variable frequency lasers;

a variable frequency etalon generating a grid of regularly spaced interference fringe lines, light from the lasers being directed to the etalon;

a gas having a gas spectral line;

a grid control loop tuning the grid to the gas spectral line; and a plurality of laser frequency control feedback loops, each laser control loop coupling light from an associated laser, as transmitted from the etalon, back to the laser so as to tune a frequency of the laser to an associated fringe line.

11. A device as in claim 10, wherein a first laser control loop maintains alignment between a first laser frequency and a first fringe line of the etalon, the first laser also transmitting light through the gas so that the gas imposes the gas spectral line, the grid control loop tuning the aligned laser frequency and the first fringe line of the etalon to the imposed gas spectral line so as to stabilize the grid of the etalon.

12. A device as in claim 11, further comprising a first sensor downstream of the first laser after the gas for sensing alignment of the first laser frequency with the imposed gas spectral line, the grid control loop varying a temperature of the etalon in response to the first sensor so as to lock the grid to the gas spectral line.

13. A device as in claim 12, further comprising a second sensor downstream of the first laser after the etalon for sensing alignment of the first laser frequency with the first fringe line of the etalon, the first laser frequency control loop varying an injection current of the first laser to lock the first laser frequency to the first fringe line.

14. A device as in claim 13, further comprising a beam splitter disposed downstream of the first laser before the first sensor and the second sensor.

15. A device as in claim 11, wherein light from each of the plurality of lasers is transmitted to the gas and the etalon, further comprising, for each laser:

a sensor downstream of the laser after the gas for sensing alignment of the laser with the gas spectral line; and another associated sensor downstream of the laser after the etalon, the associated frequency control loop varying an injection current of the laser to lock the frequency of the laser to the associated fringe line per the other associated sensor.

16. A device as in claim 11, wherein the light from the first laser provides a first independent optical channel for modulation with signals, the plurality of lasers providing a plurality of additional independent optical channels for modulation with signals.

17. A device as in claim 10, wherein the light from the plurality of lasers provides a plurality of independent optical channels for modulation with signals, and further comprising:

a spare laser directing light to the etalon; and a spare laser frequency control feedback loop coupling light from the etalon to the spare laser so as to tune a laser frequency of the spare laser to any selected member of the group consisting of the laser frequencies of the plurality of lasers so as to allow the spare laser to replace a failed laser among the plurality of lasers.

18. A device as in claim 10, wherein the laser frequency control loops and the grid control loop merge together into a digital control circuit.

19. A multi-channel Dense Wavelength Division Multiplexing (DWDM) transmitter for use in optical communication, comprising:

a plurality of variable frequency lasers;

a variable frequency grid generator providing regularly spaced interference fringe lines, light from the lasers being directed to the grid generator;

a gas having a gas spectral line, light from a first laser of the plurality of lasers being directed to the gas;

a plurality of laser frequency control feedback loops coupled to the light from the grid generator, each laser control loop controlling a frequency of an associated laser so as to maintain the frequency in alignment with an associated fringe line; and a grid control loop coupled to the light from the gas so as to maintain the grid in alignment with the gas spectral line.

* * * * *